(12) United States Patent
Russell et al.

(10) Patent No.: US 6,414,974 B1
(45) Date of Patent: Jul. 2, 2002

(54) METHOD AND A CONTROL CIRCUIT FOR CONTROLLING THE EXTINCTION RATIO OF A LASER DIODE

(75) Inventors: Brian Keith Russell; Peter Real, both of Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/390,890

(22) Filed: Sep. 7, 1999

(51) Int. Cl.[7] ............................. H01S 3/30; H01S 3/13; H04B 10/06; G01J 1/32
(52) U.S. Cl. ..................... 372/38.02; 372/8; 372/29.01; 372/29.015; 250/205; 359/189
(58) Field of Search .............................. 3722/38.02, 31, 3722/29.015, 29.011, 8; 250/205; 359/187, 189

(56) References Cited

U.S. PATENT DOCUMENTS 5,502,298 A  *  3/1996  Geller ........................ 250/205
5,850,409 A     12/1998  Link

* cited by examiner

*Primary Examiner*—Frank G. Font
*Assistant Examiner*—Armando Rodriguez

(74) *Attorney, Agent, or Firm*—Wolf, Greenfield & Sacks, P.C.

(57) ABSTRACT

A control circuit (10) controls the operation of a laser diode (1) for controlling the average power output ($P_{av}$) and the extinction ratio. A state machine (21) controls the control circuit (10) which reads the current from a monitor photo diode (2) which is coupled to the laser diode (1). An amplifier (20) determines the average power output of the laser diode (1) which is fed to a first comparator (23). The first comparator (23) compares the average power output with a reference value set by a resistor (R3). The output from the comparator (23) is fed to the up/down pin of a first counter (25) which is clocked by the state machine (21). In the event that the average power output is too high the first counter (25) decreases the bias current to the laser diode (1) outputted by a constant current source (5), and vice versa. To determine the extinction ratio of the laser diode (1) the slope of the operating portion of the power/current characteristic curve is determined by applying an incremental increase ($\Delta I_m$) to the modulation current ($I_m$) of the laser diode (1), which is a small percentage of the modulation current ($I_m$). The increase ($\Delta P_{av}$) to the average power output ($P_{av}$) of the laser diode (1) resulting from the increase $\Delta I_m$ to the modulation current $I_m$ is determined through a latch (29) and an adder (33) and is fed to a second comparator (35) which compares the increase $\Delta P_{av}$ in the average power output with a reference value ($\Delta P_{avref}$) set by the resistor (R4). A second up/down counter (28) increases the modulation current ($I_m$) applied to the laser diode (1) by a constant current source (6) if the value of ($\Delta P_{av}$) is less than ($\Delta P_{avref}$) and vice versa.

36 Claims, 6 Drawing Sheets

METHOD AND A CONTROL CIRCUIT FOR CONTROLLING THE EXTINCTION RATIO OF A LASER DIODE

FIELD OF THE INVENTION

The present invention relates to a method and to a control circuit for controlling the extinction ratio of a laser diode, and in particular, though not limited to a method and to a control circuit for controlling the extinction ratio of a laser diode of the type for use in optical transmission of digital data, for example, in telecommunications. The invention may also relate to a method and to a control circuit for controlling the average power output of a laser diode, and to a driver circuit for driving a laser diode.

BACKGROUND OF THE INVENTION

Laser diodes are extensively used in optical transmission systems as light emitters for transmitting data in digital form over telecommunications networks. Such laser diodes have an optical power output/current input characteristic curve, which has an initial inactive linear portion which is almost horizontal with a very slight upward slope. The curve then has a knee portion which is generally called the threshold point at which stimulated light emission commences. The characteristic curve then continues as a relatively linear portion with a relatively steep slope. This, is referred to as the linear operating portion of the slope. A bias current is applied to the laser diode of value sufficient to maintain a predetermined average optical power output. A switched modulation current is applied to the laser diode to establish a predetermined extinction ratio.

However, the power/current characteristic curve tends to vary with temperature and also varies as the laser diode ages. Three typical power/current characteristic curves of a laser diode, namely, curves A, B and C are illustrated in FIG. 1. The curves A, B and C illustrate how the power/current characteristic curves vary with temperature. The curve A illustrates the power/current characteristic curve of the laser diode when operating at 0° C. The curve B illustrates the characteristic curve of the laser diode operating at 25° C., while the curve C illustrates the characteristic curve of the laser diode operating at 70° C. An operating range of 0° C. to 70° C. is not an unusual operating temperature range for a laser diode. In each curve A, B and C the inactive portion is illustrated by the letter e. The threshold point of the curve is illustrated by he letter f, while the operating portion of each curve is illustrated by the letter g.

The input current in milliamps (mA) to the laser diode is plotted on the X axis of the graph of FIG. 1 while the optical power output in milliwatts (mW) of the laser diode is plotted on the Y axis. The bias current to the laser diode is indicated as $I_b$, while the modulation current is indicated as $I_m$. The power output of the laser diode when the bias current $I_b$ and the modulation current $I_m$ are applied to the laser diode is indicated as $P_1$ while the power output of the laser diode when the only current applied to the laser diode is the bias current $I_b$ is indicated as $P_0$. The average power output of the laser diode is indicated as $P_{av}$ which is equal to half the sum of $P_1$ and $P_0$, assuming an equal number of digital ones and zeros in the data stream. In order for the laser diode to operate efficiently, the bias current should be sufficient to operate the laser diode in the linear operating portion of the power/current characteristic curve just above the threshold point, in other words, the point h of the curve B, for example. Thereby the bias current operates the laser diode to produce a power output of $P_0$. In this way, when the modulation current $I_m$ is applied to the laser diode on top of the bias current $I_b$ the laser diode operates in the linear operating portion of the curve, namely, between the point h and the point k on the curve B. By operating the laser diode so that the power output varies between the points h and k on the characteristic curve B in response to the modulation current the laser diode operates with the optimum extinction ratio, which is the ratio of the power output $P_1$ to the power output $P_0$.

However, it will be clear from the curves A, B and C of FIG. 1 that should the operating temperature of the laser diode vary, unless the bias current $I_b$ and the modulation current $I_m$ are varied to compensate for the change in operating temperature the laser diode will operate incorrectly. For example, if the bias current $I_b$ and the modulation current $I_m$ were set to operate the laser diode at an operating temperature of 25° C., an increase in the operating temperature would immediately cause the extinction ratio of the laser diode to drop, and also would result in a reduction in the average power output $P_{av}$ of the laser diode.

Accordingly, in order for a laser diode to provide an adequate extinction ratio over its life and over a typical range of operating temperatures, control circuitry is required for altering the bias current $I_b$ and the modulation $I_m$ to compensate for changes in operating temperature and as the laser diode ages. Typical control circuits which are known monitor the operating temperature of the laser diode, and alter the bias current and/or the modulation current in response to temperature change of the laser diode. A disadvantage of such circuits is that they tend to be inaccurate. They do not measure the extinction ratio directly. Measuring temperature gives only an indirect measure of the extinction ratio, and obviously, is not particularly accurate, since the extinction ratio as discussed may, in general, drift with age. Thus, any corrections made to correct the extinction ratio based on the operating temperature of the laser diode may be incorrect, thus leading to incorrect operation of the laser diode.

There is therefore a need for a method and a control circuit for controlling the extinction ratio of a laser diode.

SUMMARY OF THE INVENTION

According to the invention there is provided a method for controlling the extinction ratio of a laser diode, the method comprising the steps of comparing a value of the power/current characteristic curve of the laser diode indicative of the slope of the operating portion of the power/current characteristic curve with a predetermined corresponding reference slope value, and altering the modulation current to the laser diode in response to the slope value not comparing favourably with the reference slope value.

In one embodiment of the invention the slope value of the power/current characteristic curve is determined by altering the modulation current by a predetermined test amount, and determining the corresponding change in the average power output of the laser diode resulting from the alteration to the modulation current by the test amount.

Preferably, the predetermined test amount by which the modulation current is altered is of magnitude sufficiently small as not to affect normal operation of the laser diode.

Advantageously, the predetermined test amount by which the modulation current is altered is proportional to the modulation current when the modulation current is being altered. Ideally, the modulation current is increased by the predetermined test amount.

In one embodiment of the invention the predetermined test amount by which the modulation current is altered does not exceed 5% of the value of the modulation current when the modulation current is being altered, and preferably, the predetermined test amount by which the modulation current is altered does not exceed 1% of the value of the modulation current when the modulation current is being altered.

In another embodiment of the invention the modulation current to the laser diode is altered by a predetermined correcting amount in response to the slope value of the power/current characteristic curve not comparing favourably with the reference slope value. Advantageously, the correcting amount by which the modulation current is altered in response to the slope not comparing favourably with the reference slope value does not exceed 1% of the maximum value of the modulation current which may be applied to the laser diode.

In one embodiment of the invention the slope value of the power/current characteristic curve of the laser diode is compared with the reference slope value at periodic intervals.

In another embodiment of the invention the reference slope value is set and stored during calibration of the laser diode.

In a further embodiment of the invention the stored reference slope value is a reference value of the change in the average power output of the laser diode which should result from the alteration to the modulation current by the predetermined test amount if the laser diode were operating at the desired extinction ratio.

In one embodiment of the invention the method further comprises the step of controlling the average power output of the laser diode by comparing the average power output with a predetermined reference average power output value, and varying the bias current to the laser diode in response to the average power output not comparing favourably with the reference average power output value.

Preferably, the bias current to the laser diode is altered by a predetermined correcting amount in response to the average power output not comparing favourably with the reference average power output value.

Preferably, the comparison of the slope value with the reference slope value and the comparison of the average power output with the reference average power output value are alternately made.

Advantageously, the bias current to the laser diode is maintained constant during the period while the slope value of the power/current characteristic curve is being determined.

Additionally, the invention provides a control circuit for controlling the extinction ratio of a laser diode, the control circuit comprising:
- a means for determining a value of the power/current characteristic curve of the laser diode indicative of the slope of the operating portion of the power/current characteristic curve,
- a slope comparing means for comparing the value indicative of the slope of the power/current characteristic curve with a corresponding predetermined reference slope value, and
- a first control means for controlling the modulation current to the laser diode, the first control means being responsive to the slope comparing means for altering the modulation current in response to the slope value not comparing favourably with the reference slope value.

In one embodiment of the invention the means for determining the value indicative of the slope of the power/current characteristic curve of the laser diode comprises:
- a second control means for altering the modulation current to the laser diode by a predetermined test amount, and
- a means for determining the corresponding change in the average power output of the laser diode resulting from the alteration of the modulation current by the test amount.

In another embodiment of the invention the slope comparing means compares the change in the average power output of the laser diode with the reference slope value.

Preferably, the second control means maintains the alteration to the modulation current by the test amount for a period sufficient to allow the resulting corresponding change in the average power output of the laser diode to be determined. Advantageously, the predetermined test amount by which the modulation current is altered by the second control means is such as not to affect the normal operation of the laser diode. Preferably, the predetermined test amount by which the modulation current is altered by the second control means is proportional to the modulation current when the modulation current is being altered. Advantageously, the second control means increases the modulation current by the predetermined test amount. Preferably, the predetermined test amount by which the modulation current is altered by the second control means does not exceed 5% of the modulation current when the modulation current is being altered. Ideally, the predetermined test amount by which the modulation current is altered by the second control means does not exceed 1% of the modulation current when the modulation current is being altered.

In one embodiment of the invention the first control means alters the modulation current by a predetermined correcting amount in response to the slope value not comparing favourably with the reference slope value. Preferably, the correcting amount by which the first control means alters the modulation current in response to the slope value not comparing favourably with the reference slope value does not exceed 1% of the maximum value of the modulation current which may be applied by the first control means.

In one embodiment of the invention the control circuit further comprises a power output comparing means for comparing the average power output of the laser diode with a predetermined reference average power output value, and a bias current control means for controlling the bias current to the laser diode, the bias current control means being responsive to the power output comparing means for altering the bias current to the laser diode in response to the average power output of the laser diode not comparing favourably with the reference average power output value.

Preferably, the slope comparing means and the power output comparing means are alternately operated for alternately comparing the slope value with the reference slope value and the average power output with the reference average power output value, respectively.

Advantageously, the bias current control means holds the bias current constant while the second control means is altering the modulation current by the predetermined test amount.

Preferably, a means is provided for setting the predetermined reference slope value.

Further the invention provides a laser diode driver circuit comprising:
- a modulation current source for providing a current for modulation in response to a data stream to be transmitted by the laser diode,
- a bias current source for providing a bias current to the laser diode, a control circuit for controlling the extinction ratio of the laser diode, the control circuit comprising:

a means for determining a value of the power/current characteristic curve of the laser diode indicative of the slope of the operating portion of the power/current characteristic curve, a slope comparing means for comparing the value indicative of the slope of the power/current characteristic curve with a corresponding predetermined reference slope value, and a first control means for controlling the modulation current source, the first control means being responsive to the slope comparing means for altering the modulation current from the modulation current source in response to the slope value not comparing favourably with the reference slope value.

ADVANTAGES OF THE INVENTION

The advantages of the invention are many. The method and control circuit allow for accurate control of the extinction ratio of a laser diode. By monitoring and determining the slope of the operating portion of the power/current characteristic curve the operating characteristics of the laser diode are directly monitored, and thus, the extinction ratio can be accurately controlled. The extinction ratio may be corrected by making relatively small incremental or decremental changes to the modulation current as appropriate, and each incremental or decremental change may be of a predetermined correcting amount. After each incremental or decremental change, after checking the average power output of the laser diode and making an appropriate correction to the bias current if required, the slope value of the power/current characteristic curve is again determined and a further appropriate incremental or decremental change in the modulation current is made. In this way correction of the extinction ratio is made in a series of steps, each step correction being made by incrementing or decrementing the modulation current by a predetermined correcting amount. Alternatively, the control circuit may be provided with additional intelligence, which would allow computation of the full correcting amount by which the modulation current should be incremented or decremented in order to correct the extinction ratio, and the modulation current could then be altered by the appropriate correcting amount in one step.

A further advantage of the invention is that where a monitoring photo diode is used for monitoring the average power output and the change in average power output from the laser diode, the method and control circuit according to the invention operate independently from the capacitance of the monitoring photo diode, in other words, the capacitance of the monitoring photo diode has no affect on the method and control circuit. The method and control circuit also provide a relatively low band width non-peak detection method which facilitates ease of implementation. By virtue of the fact that the test amount by which the modulation current is altered is relatively small, and in particular, is a relatively small proportion of the modulation current no degradation is caused to the optical power output. A further advantage of the invention is achieved when the modulation current is altered by increasing the modulation current by the test amount, rather than by decreasing the modulation current by the test amount, in that the extinction ratio is slightly increased, rather than decreased, and this, thus, further avoids any degradation in the optical power output.

Additionally, the method and control circuit provide a relatively simple and accurate method and circuit for controlling the extinction ratio, and as well the average optical power output which has no affect on the data transmission. Additionally, the method and control circuit permit accurate correction of the extinction ratio without affecting data transmission, and thus, the extinction ratio can be corrected during normal operation of the laser diode. Furthermore, since in order to determine the slope of the power/current characteristic curve the modulation current only is altered by the test amount, the power output of the laser diode resulting from the bias current remains unaltered. Accordingly, laser chirp (change in wave length) is avoided during the period while the slope of the power/current characteristic curve is being determined and while correction if any is being made to the modulation current as the method for controlling the extinction ratio is being carried out.

The invention will be more clearly understood from the following description of a preferred embodiment thereof which is given by way of example only with reference to the accompanying drawings.

DETAILED DESCRIPTION OF A PREFERRED EMBODIMENT

Figure 1:
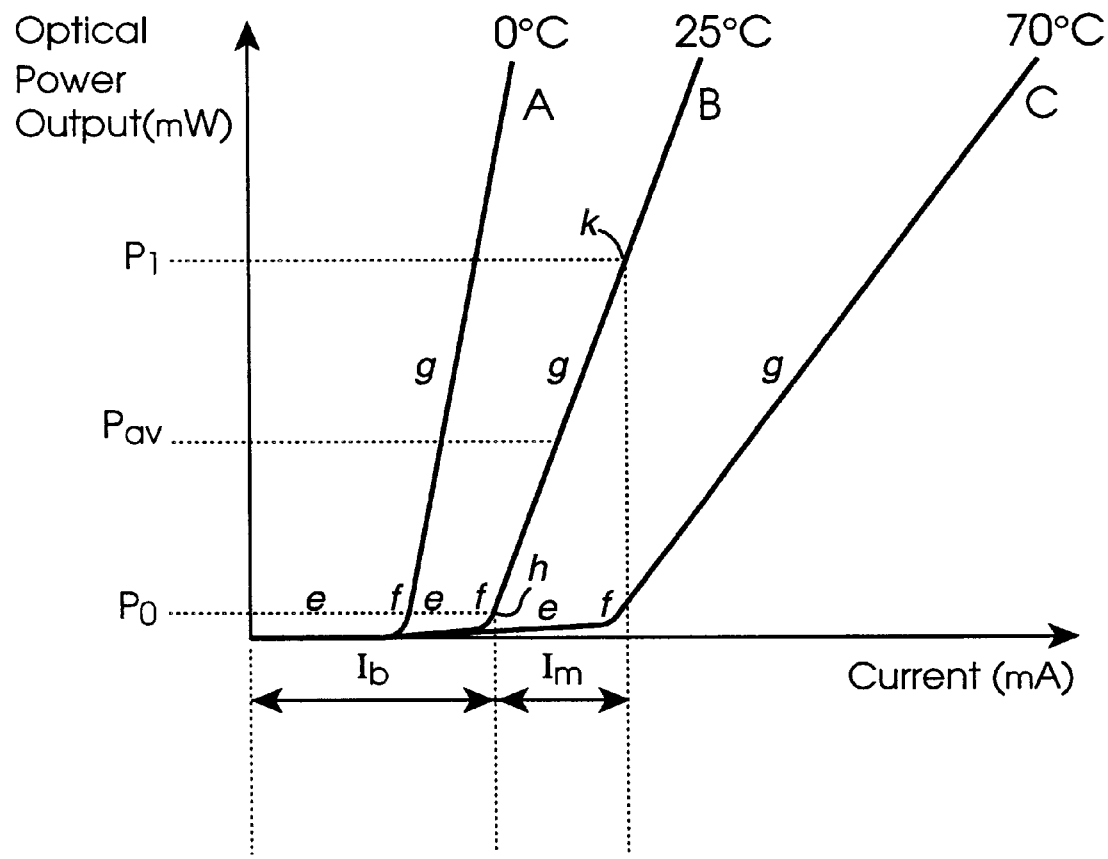
FIG. 1 illustrates typical power/current characteristic curves of a typical laser diode.
Figure 2:
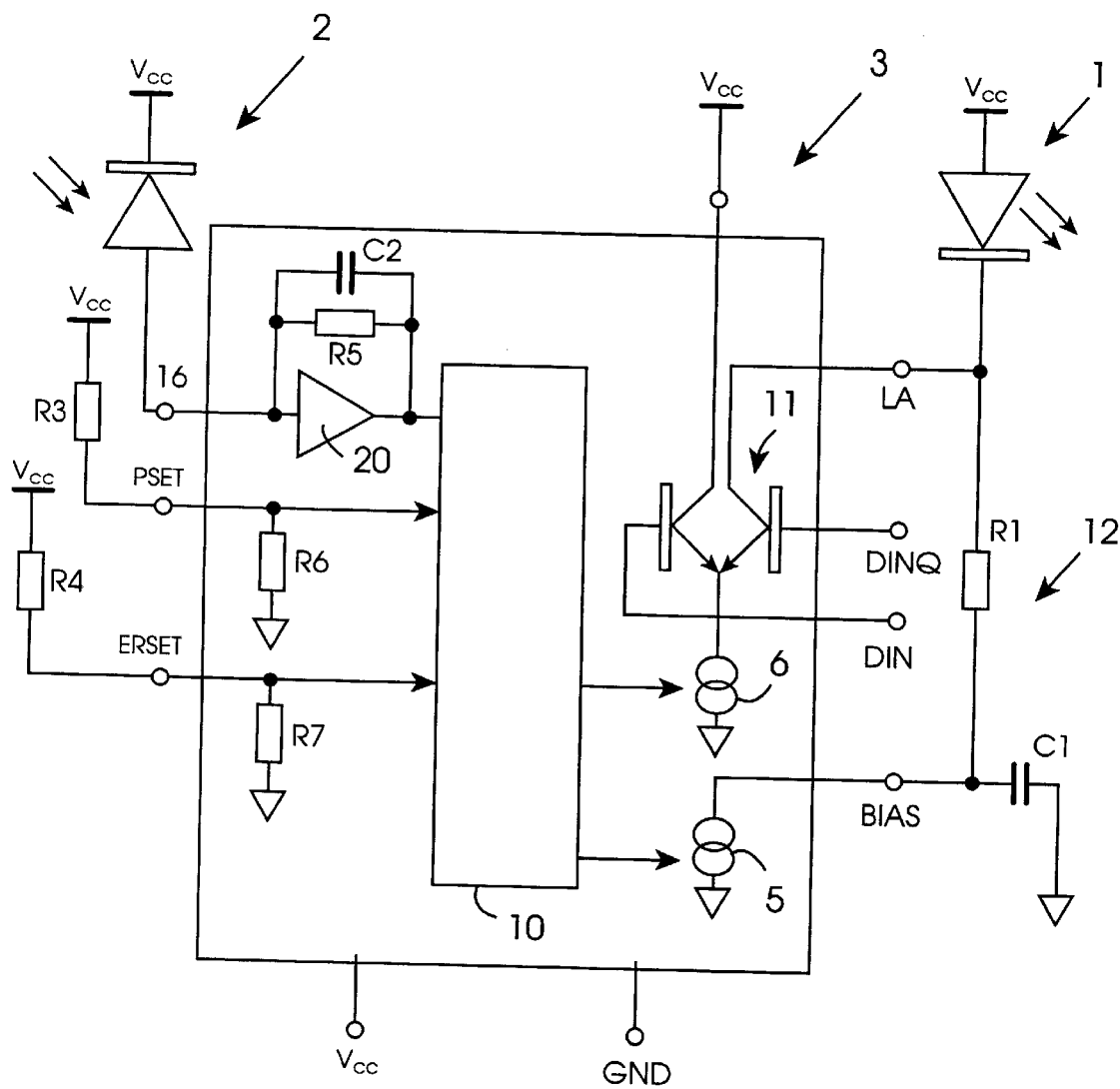
FIG. 2 is a block representation of a laser diode driver circuit according to the invention for driving an optical transmission laser diode for transmitting data in digital optical form.
Figure 3:
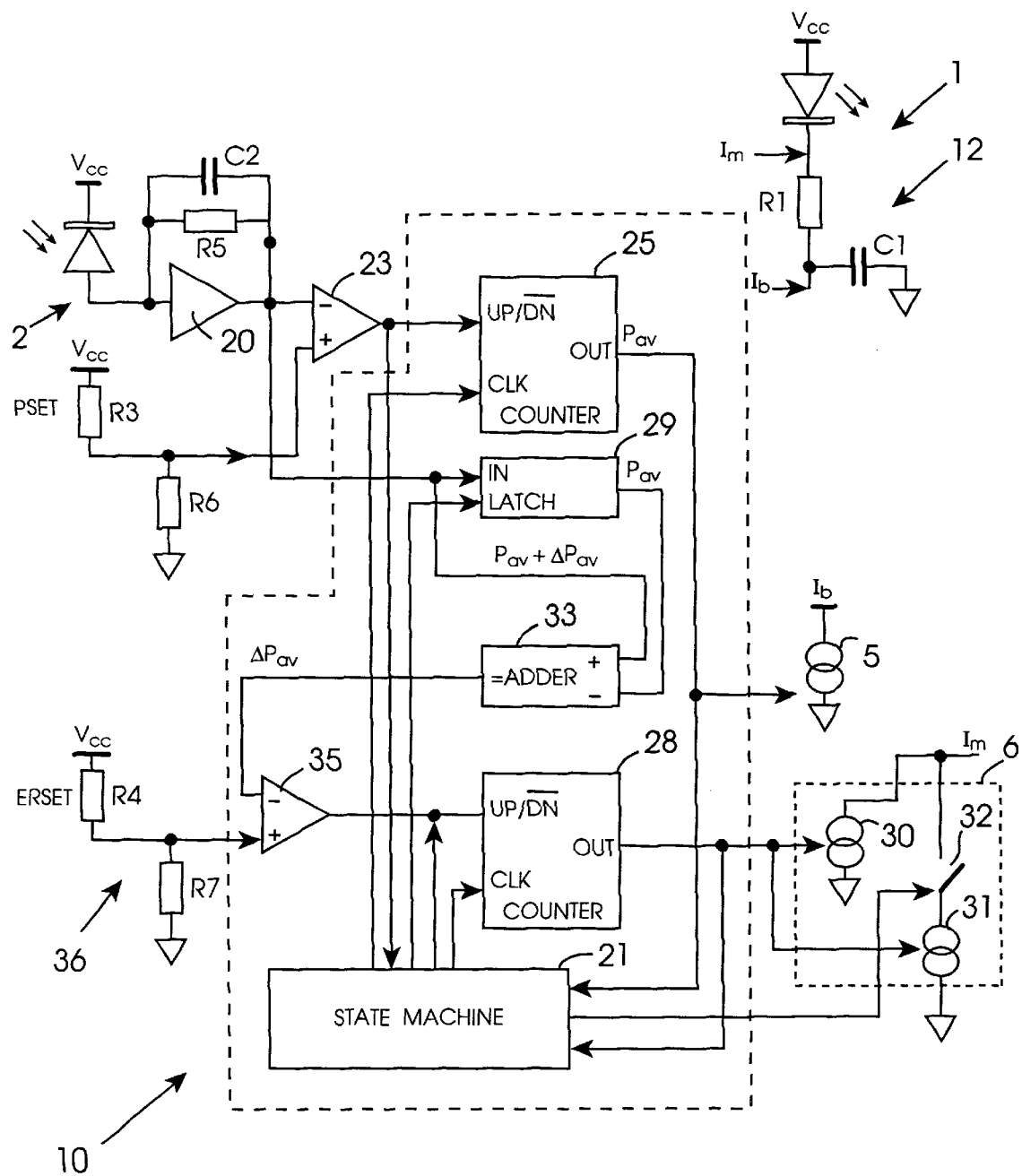
FIG. 3 is a block representation of a control circuit also according to the invention of the laser diode driver circuit of FIG. 2.

Referring to the drawings, and in particular to FIGS. 2 and 3, the method according to the invention controls the bias current $I_b$ and the modulation current $I_m$ to an optical transmission laser diode 1 for operating the laser diode 1 at a desired average power output $P_{av}$ and at an optimum extinction ratio. A monitor photo diode 2 is coupled to the laser diode 1 for facilitating monitoring of the optical power output P of the laser diode 1. The monitor photo diode 2 outputs a current which is proportional to the optical power output of the laser diode 1. A driver circuit 3 according to the invention drives the laser diode 1 and comprises a digitally controlled constant current source 5 for providing the bias current $I_b$ to the laser diode 1 and a digitally controlled constant current source 6 for providing the modulation current $I_m$ to the laser diode 1. A control circuit 10 also according to the invention located in the driver circuit 3 control s the bias current source 5 and the modulation current source 6 for in turn controlling the bias current $I_b$ and the modulation current $I_m$, respectively, to the laser diode 1. The driver circuit 3 and the control circuit 10 are described in detail below.

The method according to the invention for controlling the laser diode 1 to operate at a desired average optical power output $P_{av}$ requires that the average power output $P_{av}$ from the laser diode 1 be monitored by the control circuit 10 at predetermined intervals of time, typically, 2 msec intervals. The average optical power output $P_{av}$ of the laser diode 1 is determined by monitoring the power output of the laser diode 1 over a predetermined time period of approximately 1 msec. If the average power output determined by the control circuit 10 compares favourably, in other words, is equal to a stored predetermined reference average power output value, no action is taken. On the other hand, should the average power output of the laser diode 1 determined by the control circuit 10 not be equal to the stored predetermined reference average power output value corrective action is taken. The control circuit 10 operates the bias current source 5 for increasing the bias current $I_b$ to the laser diode 1 if the average power output of the laser diode 1 is less than the reference value, and vice versa. The amount by which the control circuit 10 increases or decreases the bias current $I_b$ from the bias current source 5 for convenience is referred to as a correcting amount, and depends on the control circuit 10 and the type of constant current source 5. This will be readily apparent to those skilled in the art. However, in this embodiment of the invention the correcting amount by which the bias current $I_b$ is increased or decreased is a constant amount and typically is approximately 0.1 mA, and, in general, is insufficient for correcting the average power output in one monitoring cycle. Thus, correction of the average power output is carried out over a number of monitoring cycles. However, on start up (power up) the value of the correcting amount may be greater in order to rapidly bring the laser diode up to the desired operating average power output.

The method according to the invention for controlling the laser diode 1 to operate at a desired extinction ratio requires that the slope of the linear operating portion of the power/current characteristic curve be monitored. The control circuit 10 according to the invention determines the slope value of the linear operating portion of the power/current characteristic curve at predetermined time intervals typically of 2 msecs, and if the slope value of the operating portion of the power/current characteristic curve compares favourably with the reference slope value, in other words, is equal to the reference slope value no action is taken. If the slope value of the linear operating portion of the power/current characteristic curve is less than the reference slope value, the control circuit 10 operates the modulation current source 6 for increasing the modulation current $I_m$ by a predetermined correcting amount, and vice versa. The correcting amount by which the modulation current is increased and decreased under the control of the control circuit 10 depends on the type of modulation current source 6 and the control circuit 10. This will be well known to those skilled in the art. However, in this embodiment of the invention the correcting amount by which the modulation current is increased or decreased is fixed, and in this case is 0.1 mA approximately.

During the periods while the control circuit 10 is determining the slope value of the linear operating portion of the power/current characteristic curve, the control circuit 10 controls the bias current source 5 for holding the bias current $I_b$ constant. Since each time the modulation current $I_m$ is altered it may be necessary to alter the bias current $i_b$, the control circuit 10 alternately cycles between a control loop which is described below for correcting the average optical power output of the laser diode 1 and for correcting the extinction ratio of the laser diode 1.

Figure 7:
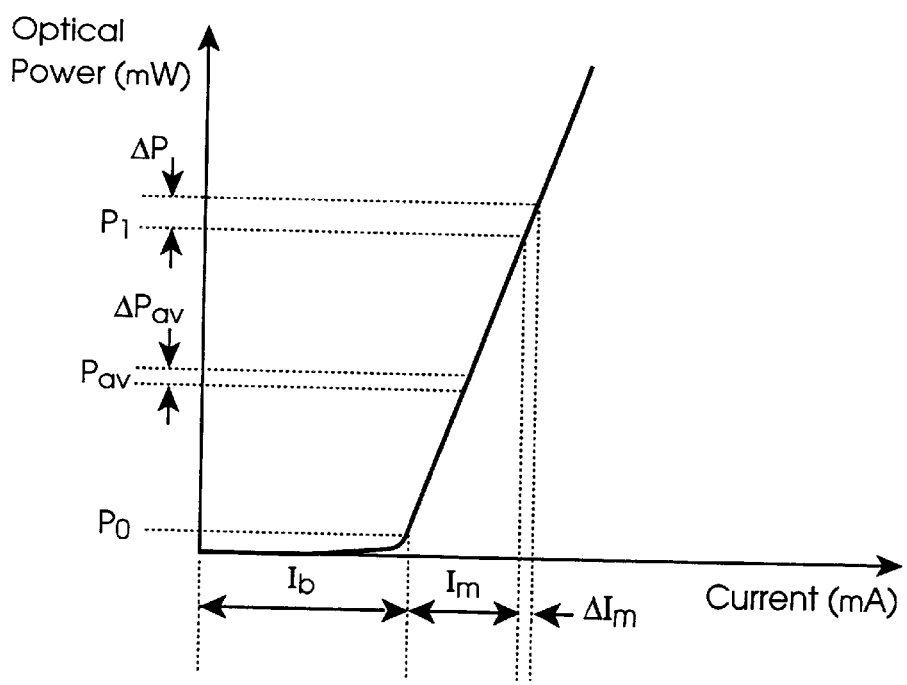
FIG. 7 illustrates a power/current characteristic curve of a laser diode operating under the control of the control circuit of FIG. 3.

The slope of the linear operating portion of the power/current characteristic curve is determined by the control circuit 10 as follows with particular reference to FIG. 7. The control circuit 10 operates the modulation current source 6 for increasing the modulation current $I_m$ to the laser diode 1 by a predetermined incremental test amount $\Delta I_m$, which in this embodiment of the invention is proportional to the modulation current $I_m$ when the increase is being made, and is a fixed proportion K of the modulation current, namely, 1% of the modulation current. The control circuit 10 then monitors the current output from the monitor photo diode 2 for determining the increase $\Delta P_{av}$ in the average optical power output $P_{av}$ resulting from the incremental test amount $\Delta I_m$ by which the modulation current $I_m$ was increased. The increase in the average optical power output $\Delta P_{av}$ is proportional to the slope value of the linear operating portion of the power/current characteristic curve. The slope value LI of the operating portion of the power/current characteristic curve is derived from the following equation:

$$LI = \frac{\Delta P}{\Delta I_m}$$

Where $\Delta P$ is the increase in the optical power output of the laser diode resulting from the increase $I_m$ to the modulation current $I_m$, see FIG. 7.

$$\Delta P = \Delta I_m LI$$
$$= K I_m LI$$
$$P_{av} = \frac{P_0 + P_1}{2}$$
$$P_{av} + \Delta P_{av} = \frac{P_0 + P_1 + \Delta P}{2}$$
$$\Delta P_{av} = \frac{P_0 + P_1 + \Delta P}{2} - P_{av}$$
$$= \frac{\Delta P}{2}$$

$\alpha \Delta P$ $\alpha K I_m LI$, K in this case being 0.01

Therefore, the change $\Delta P_{av}$ in the average power output of the laser diode 1 resulting from the test change $\Delta I_m$ to the modulation current $I_m$ gives a direct measure of the slope LI of the linear operating portion of the power/current characteristic curve. Thus, in this embodiment of the invention the predetermined reference slope value is stored as the value $\Delta P_{avref}$ which is the value of the change in the average power output which would result from the test amount increase $\Delta I_m$ to the modulation current $I_m$ if the laser diode 1 were operating at the desired extinction ratio.

Referring now to FIG. 2, the driver circuit 3 will now be described. Two pins, namely, $V_{cc}$ and GND are provided to the driver circuit 3 for applying a control voltage $V_{cc}$ and for grounding the driver circuit 3, respectively. The modulation current $I_m$ from the constant current source 6 is modulated by a data switching circuit 11 and is outputted through a pin LA to the laser diode 1. Data input pins DIN and DINQ are provided to the driver circuit 3 for inputting data signals to the data switching circuit 11. An impedance matching circuit 12 comprising a resistor R1 and a capacitor C2 matches the impedance of the laser diode 1 with that of the driver circuit. An output pin BIAS outputs the bias current $I_b$ from the constant current source 5 to the laser diode 1.

An input pin 16 to the driver circuit 3 receives the current output from the monitor photo diode 2 which is proportional to the optical power output of the laser diode 1. Input pins PSET and ERSET to the driver circuit 3 are provided for setting the predetermined reference average power output value $P_{avref}$, and for setting the predetermined reference value $\Delta P_{avref}$ of the increase in the average power output value for determining the slope of the linear operating portion of the power/current characteristic curve of the laser diode 1, respectively. The predetermined reference values of the average power output $P_{avref}$ and the increase in average power output $\Delta P_{avref}$ are set by resistors R3 and R4, which provide a constant current to the resistors R6 and R7, respectively. The resistors R3 and R4 are connected to $V_{cc}$, and in this embodiment of the invention a voltage of 1.5 volts is established across each resistor R3 and R4. This develops respective constant currents in the resistors R3 and R4, which are in turn passed into the resistors R6 and R7, respectively, across which respective voltages are developed for setting the reference values of $P_{avref}$ and $\Delta P_{avref}$.

Referring now in particular to FIG. 3 a main control means for controlling the control circuit 10 comprises a state machine 21. A trans-impedance amplifier 20 receives the current from the monitor photo diode 2 and a gain control resistor R5 and a capacitor C2 control the gain of the amplifier 20 for determining the average current from the monitor photo diode 2 for in turn determining average optical power output $P_{av}$ of the laser diode 1. This is fed in the form of a voltage to a power output comparing means, namely a first comparator 23 of the control circuit 10 which compares the output from the amplifier 20 with the reference voltage across the resistor R6 ($P_{avref}$) and the output from the first comparator 23 is fed to the state machine 21.

The output from the first comparator 23 is also fed to a bias current control means, namely, to the up/down pin of a first counter 25 which is clocked by the state machine 21. If the output from the first comparator 23 is high indicating that the average optical power output $P_{av}$ from the laser diode 1 is less than the reference average power output value $P_{avref}$, the first counter 25 counts up by one thereby outputting a digital up count on its output pin to the digitally controlled constant current source 5 for increasing the bias current $I_b$ to the laser diode 1 by the correcting amount. If the first counter 25 is a ten bit counter and the maximum current output from the constant current source 5 is 100 mA the amount by which the bias current $I_b$ is increased is 100/210 mA, which is approximately 0.1. mA. In the event that the output from the first comparator 23 is low indicating that the average optical power output $P_{av}$ from the laser diode 1 is greater than the reference average power output value $P_{avref}$ the first counter 23 counts down by one thereby operating the output constant current source 5 to decrease the bias current $I_b$ by the correcting amount of $100/2^{10}$ mA.

A modulation current control means, namely, a second counter 28 which is clocked by the state machine 21 controls the constant current source 6 for increasing and decreasing the modulation current $I_m$ in response to the slope value of the linear operating portion of the power/current characteristic curve determined by the control circuit 10. The constant current source 6 comprises a first control means, namely, a first digitally controlled constant current source 30 for applying the modulation current $I_m$ to the laser diode 1 and for varying the modulation current $I_m$ by the correcting amounts. The constant current source 6 also comprises a second control means, namely, a second digitally controlled constant current source 31 for applying the incremental test amount increase $\Delta I_m$ to the modulation current Im to the laser diode 1 as will be described below. A switch 32 operated under the control of the state machine 21 connects the second constant source 31 to the laser diode 1 for applying the test amount increase $\Delta I_m$ to the laser diode 1. The second counter 28 controls the first constant current sources 30 and the second constant current source 31 in the same manner as the first counter 25 controls the digitally controlled constant current source 5. The second constant current source 31 is set to output a constant current which is always at a value of 1% of the constant current output of the first constant current source 30. Thus, when the switch 32 is closed for increasing the modulation current $I_m$ by the test amount $\Delta I_m$ the value of $\Delta I_m$ by which the modulation current $I_m$ is increased is always 1% of the value of the modulation current $I_m$ when the test amount $\Delta I_m$ is being applied.

The output from the trans-impedance amplifier 20 is also fed to a latch 29 which, under the control of the state machine 21 latches the average optical power output $P_{av}$ from the amplifier 20 before the control circuit 10 commences to determine the slope of the linear operating portion of the power/current characteristic curve. With the average power output $P_{av}$ latched the state machine 21 operates the switch 32 for applying the incremental test increase $\Delta I_m$ in the modulation current $I_m$ to the laser diode 1. The incremental test increase $\Delta I_m$ in the modulation current $I_m$ is maintained until the increased average optical power output $P_{av}+\Delta P_{av}$ of the laser diode 1 resulting from the incremental test increase $\Delta I_m$ in the modulation current $I_m$ has appeared on the output of the amplifier 20. This new value of the average optical power output $P_{av}+\Delta P_{av}$ along with the latched value of the average power output $P_{av}$ before the modulation current $I_m$ was increased by the test increment $\Delta I_m$ is fed to an adder 33 which subtracts the latched average optical power output $P_{av}$ from the new average optical power output $P_{av}+\Delta P_{av}$ thereby outputting the value of the increase in the average optical power output $\Delta P_{av}$ from the laser diode 1. A slope comparing means, namely, a second comparator 35 compares the increase in the average power output $\Delta P_{av}$ with the reference voltage developed across the resistor R7 which corresponds to the reference value $P_{avref}$. Once the increase in the average power output $\Delta P_{av}$ has been determined and compared with the reference value $\Delta P_{avref}$ the switch 32 is opened thereby isolating the laser diode 1 from the second constant current source 31.

The output from the second comparator 35 is fed to an up/down pin of the second counter 28, which controls the first constant current source 30 for increasing or decreasing the modulation current $I_m$ by the correcting amount in response to the output of the second comparator 35. In the event that the output from the second comparator 35 is high indicating that the slope of the linear operating portion of the power/current characteristic curve is less than the reference slope value, the second counter 28 counts one up, thereby causing the first constant current source 6 to increase the modulation current $I_m$ by the correcting amount. In the event that the output from the second comparator 35 is low indicating that the slope of the linear operating portion of the power/current characteristic curve of the laser diode 1 is greater than the reference slope, the second counter 28 counts down one thereby reducing the modulation current $I_m$ by the correcting amount. If the second counter 28 is a ten bit counter and the maximum modulation current $I_m$ which is delivered by the first constant current source 30 is 100 mA, each correcting amount increase or decrease made to the modulation current $I_m$ is $100/2^{10}$ mA. Since the second counter 28 also controls the second constant current source 31, each time the modulation current $I_m$ outputted by the first constant current source 30 is increased or decreased by a correcting amount, the value of the test amount $\Delta I_m$ outputted by the second constant current source 31 is correspondingly increased or decreased by 1% of the correcting amount. Therefore, the test amount $\Delta I_m$ outputted by the second constant current source 31 is always 1% of the modulation current $I_m$.

The control circuit 10 only operates to control the extinction ratio of the laser diode 1 after steady state average power output has been achieved. The state machine 21 monitors the output of the first counter 25 for determining when steady state average power output has been achieved. At which state the control circuit 10 operates as described above for alternately checking and correcting the extinction ratio and the average power output.

Figure 6:
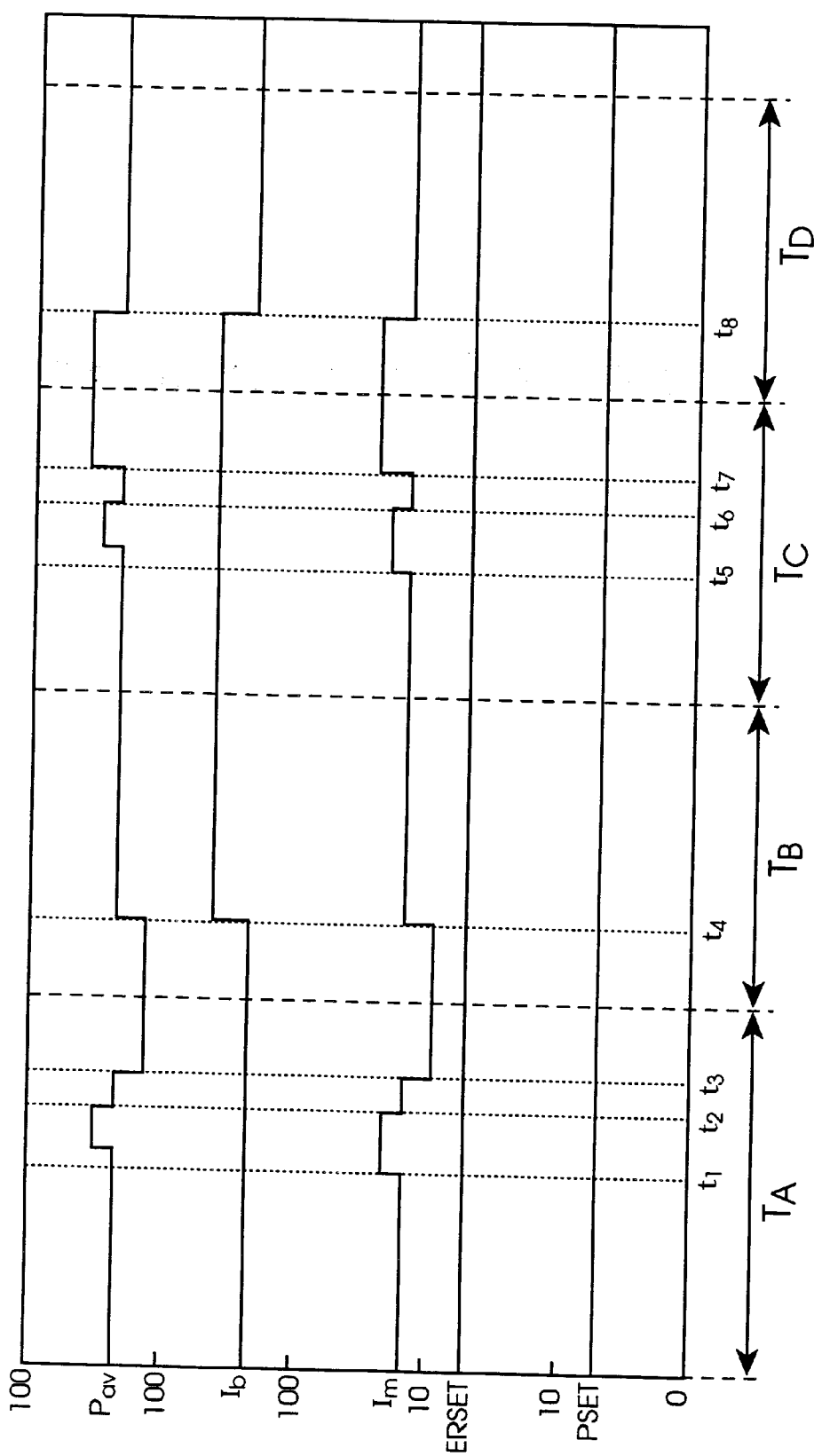
FIG. 6 illustrates a timing diagram of the operation of a laser diode under the control of the control circuit of FIG. 3.

The operation of the control circuit 10 and the laser diode 1 will be described with reference to the timing diagram of FIG. 6. As already described the control circuit 10 is operated at predetermined intervals for alternately determining the average power output of the laser diode 1 and the slope of the linear operating portion of the power/current characteristic curve. During time $T_A$ in the timing diagram of FIG. 6 the control circuit 10 is operated for correcting the extinction ratio of the laser diode 1. At time $t_1$ the modulation current $I_m$ is increased by the incremental test increment $\Delta I_m$ for a predetermined time $t=t_2-t_1$. The control circuit 10 as already described determines the increase $\Delta P_{av}$ in the average power output of the laser diode 1 resulting from the increase in the modulation current $\Delta I_m$, and this is compared in the second comparator 35 with the reference value $\Delta P_{avref}$ set by the resistor R4. The result of the comparison indicates that the increase in the value of the average power output $\Delta P_{av}$ is greater than the reference value $\Delta P_{avref}$ set by the resistor R4, and thus, at time $t_3$ the modulation current $I_m$ is reduced by the correcting amount under the control of the second counter 28 controlling the first constant current source 30. This, thus, results in a reduction in the average power output $\Delta P_{av}$ of the laser diode 1 also at the time $t_3$.

During time $T_B$ the control circuit 10 is operated for determining and correcting the average power output of the laser diode 1. The first comparator 23 determines that as a result of the decrease in the modulation current $I_m$ at time $t_3$ the average power output of the laser diode 1 is too low. The first counter 25 operates the constant current source 5 for increasing the bias current $I_b$ at time $t_4$. This in turn increases the average power output at time $t_4$. During the period $T_c$ the control circuit 10 again is operated for correcting the extinction ratio of the laser diode 1. At time $t_5$ the modulation current $I_m$ is increased by applying the incremental increase $\Delta I_m$. The increase $\Delta P_{av}$ in the average power output of the laser diode 1 is determined and compared with the reference value $\Delta P_{avref}$. At time $t_6$ when the increase $\Delta P_{av}$ in the average power output has been compared with the reference value $\Delta P_{avref}$ the incremental increase $\Delta I_m$ is removed from the laser diode 1. The control circuit 10 determines in this case that the slope of the linear operating portion of the power/current characteristic curve is less than the reference value set by the resistor R4 and the modulation current $I_m$ is thus increased under the control of the second counter 28 by the correcting amount at time $t_7$.

During time $T_D$ the control circuit 10 again makes a determination of the average power output $P_{av}$ of the laser diode 1 and determines that the average power output is too high. The control circuit 10 thus reduces the bias current $I_b$ by the correcting amount at time $t_8$, which results in a decrease in the average power output $P_{av}$.

Since the value of the incremental test amount $\Delta I_m$ by which the modulation current $I_m$ is increased is 1% of the modulation current $I_m$ when the modulation current $I_m$ is being increased, the application of the increase $\Delta I_m$ to the modulation current $I_m$ does not interfere with the transmission of data being transmitted by the laser diode 1. Accordingly, the control circuit 10 can control and correct the extinction ratio of the laser diode 1 while the laser diode 1 is transmitting data.

Figure 4:
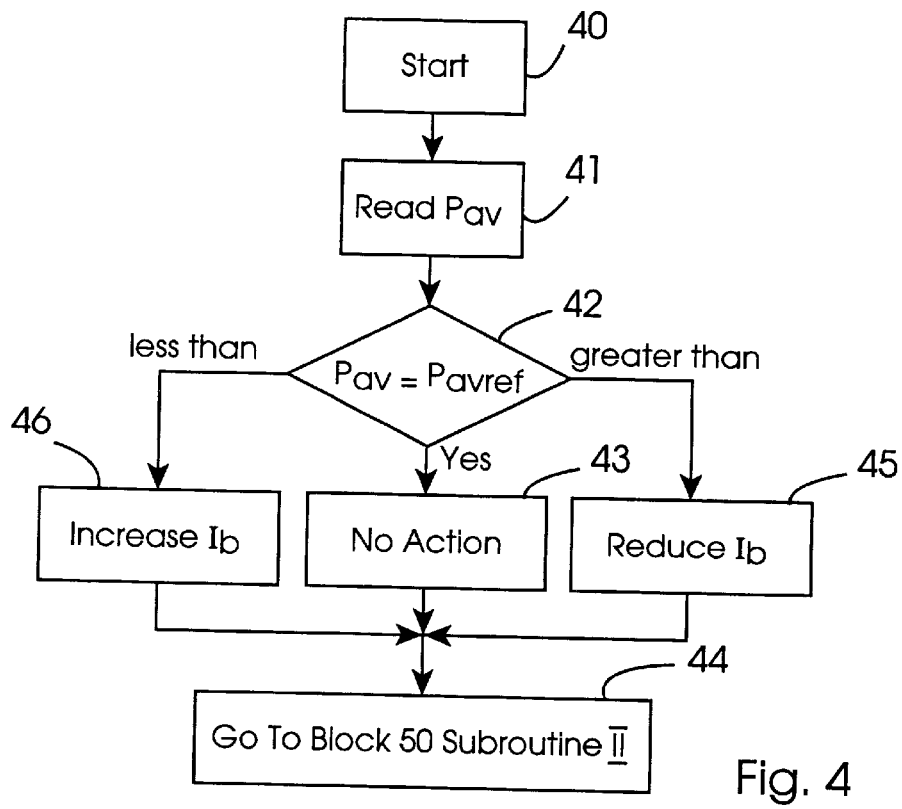
FIG. 4 is a flowchart of a sub-routine for controlling the control circuit of FIG. 3 to operate in one mode.
Figure 5:
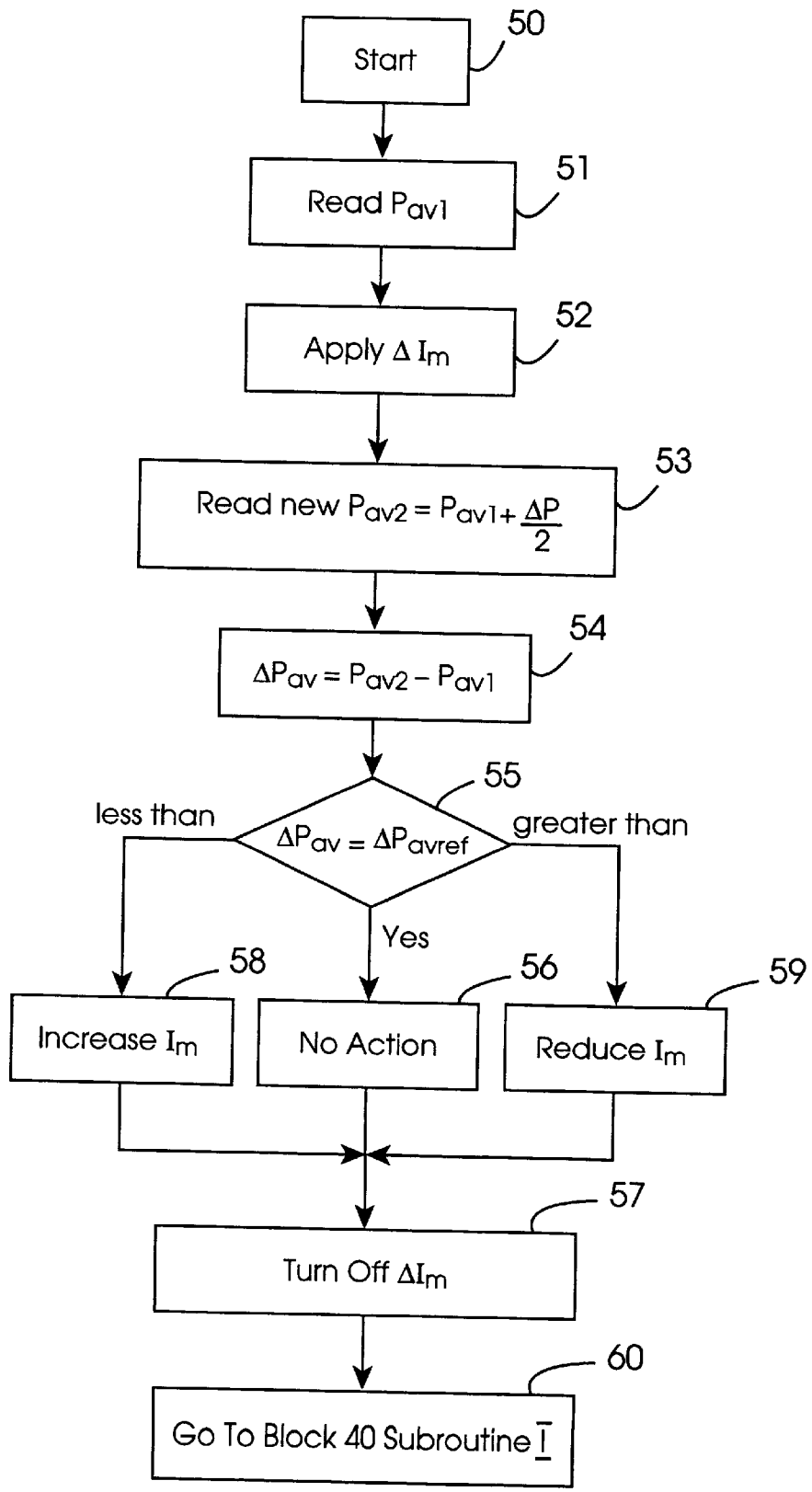
FIG. 5 is a flowchart of a sub-routine for controlling the control circuit of FIG. 3 to operate in another mode.

Referring now to FIGS. 4 and 5 there is illustrated a block representations of two sub-routines which the control circuit 10 goes through in determining and correcting the average power output of the laser diode 1 and the extinction ratio. Referring initially to FIG. 4, FIG. 4 illustrates the sub-routine for controlling the average power output of the laser diode 1. Block 40 starts the sub-routine which goes to block 41 which reads the average power output $P_{av}$ of the laser diode 1. Block 42 compares the read value of the average power output $P_{av}$ with the reference value $P_{avref}$ and if the average power output $P_{av}$ is equal to the reference value $P_{avref}$ the sub-routine moves to block 43 which takes no action, and the sub-routine moves to block 44. Block 44 calls up block 50 of the sub-routine of FIG. 5 as will be described below. If block 42 determines that the average power output $P_{av}$ is greater than the reference value $P_{avref}$ the sub-routine goes to block 45 which operates the first counter 25 for controlling the constant current source 5 for reducing the bias current $I_b$ by the correcting amount, and the sub-routine goes to block 44. In the event that block 42 determines that the average power output $P_{av}$ of the laser diode 1 is less than the reference value $P_{avref}$ block 42 moves the sub-routine to block 46 which operates the first counter 25 for controlling the constant current source 5 for increasing the bias current $I_b$ by the correcting amount. The sub-routine is then moved to block 44.

Referring now to FIG. 5 the sub-routine of FIG. 5 controls the extinction ratio of the laser diode 1. Block 50 starts the sub-routine which moves to block 51. Block 51 reads the current value of the average power output, which for convenience will be referred to as $P_{av1}$. The sub-routine then moves to block 52 which causes the state machine 21 to close the switch 32 for applying the test increase $\Delta I_m$ to the modulating current $I_m$. The sub-routine then moves to block 53 which reads the new value of the average power output, which for convenience will be referred to as $P_{av2}$ resulting from the test increase $\Delta I_m$ in the modulation current $I_m$. $P_{av2}$ is equal to $P_{av1}$ plus $\Delta P/2$. The sub-routine then moves to block 54 which determines the increase in the average power output $\Delta P_{av}$ resulting from the test increase $\Delta I_m$ in the modulation current $I_m$. The increase in the average power output $$\Delta P_{av} = P_{av2} - P_{av1}.$$

The sub-routine then moves to block 55 which compares the value of the increase $\Delta P_{av}$ of the average power output with the reference value $\Delta P_{avref}$. If $\Delta P_{av}$ is equal to $\Delta P_{avref}$ the sub-routine moves to block 56 which takes no action and moves the sub-routine to block 57. Block 57 opens the switch 32 thereby removing the test increase $\Delta I_m$ from the modulation current $I_m$ to the laser diode 1. If block 55 determines that $P_{av}$ is less than $\Delta P_{avref}$ the sub-routine moves to block 58 which causes the second counter 28 to operate the first constant current source 30 for increasing the modulation current $I_m$ by the correcting amount. The sub-routine then moves to block 57. If block 55 determines that $\Delta P_{av}$ is greater than $\Delta P_{avref}$ the sub-routine is moved to block 59 which causes the second counter 28 to operate the first constant current source 30 to reduce the modulation current $I_m$ by the correcting amount. The sub-routine routine then moves to block 57. From block 57 the sub-routine goes to block 60 which calls up block 40 of the sub-routine of FIG. 4.

In the event that the driver circuit 3 is capacitively coupled to the laser diode 1, when carrying out the test for the extinction ratio, as well as applying the test amount increase $\Delta I_m$ to the modulation current $I_m$, a test increase $\Delta I_b$ of value equal to $\Delta I_m/2$ would have to be made to the bias current $I_b$. This is because capacitive coupling would cause half the value of the test amount increase $\Delta I_m$ to be applied to the upper peaks of the modulation current $I_m$, and the other half of the test amount increase $\Delta I_m$ to be applied to the lower peaks of the modulation current $I_m$. The increase $\Delta I_b$ to the bias current $I_b$ compensates for the half of the test amount increase $\Delta I_m$ which is applied to the lower peaks of the modulation current $I_m$.

The circuit has been described for correcting the average power output $P_{av}$ and the extinction ratio by altering the bias current $I_b$ and the modulation current $I_m$ by correcting amounts of relatively small value, and thus, a series of alterations to the bias current $I_b$, and the modulation current $I_m$ by respective correcting amounts would, in general, be required in order to correct the average power output $P_{av}$ and the extinction ratio. However, it is envisaged that the circuit may be provided with intelligence, which would compute the value of the correcting amount required to the bias current $I_b$ for correcting the average power output $P_{av}$ in one correcting action, and also, it is envisaged that intelligence may be provided which knowing the slope value of the linear operating portion of the power/current characteristic curve would correct the extinction ratio by making one alteration to the modulation current by a correcting amount which would correct the extinction ratio in one alteration. However, the correcting amount to the modulation current would have to be sufficiently small as not to adversely alter $P_o$, since this could cause laser chirp, which is unacceptable.

What is claimed is:

1. A method for controlling the extinction ratio of a laser diode by sequentially:
    (a) comparing the average power output of the laser diode with a predetermined reference average power output value,
    (b) varying the bias current to the laser diode in response to the average power output not comparing favourably with the reference average power output value,
    (c) altering the modulation current to the laser diode by a predetermined test amount for a period sufficient to allow a determination to be made of a corresponding change in the average power output of the laser diode resulting from the alteration to the modulation current, the predetermined test amount by which the modulation current is altered being proportional to the modulation current when the modulation current is being altered,
    (d) determining the corresponding change in the average power output of the laser diode resulting from the alteration to the modulation current by the test amount for determining a value of the power/current characteristic curve of the laser diode indicative of the slope of the operating portion of the power/current characteristic curve,
    (e) comparing the value indicative of the slope of the power/current characteristic curve with a predetermined corresponding reference slope value, and altering the modulation current to the laser diode in response to the determined slope value not comparing favorably with the reference slope value.

2. A method as claimed in claim 1 in which the predetermined test amount by which the modulation current is altered is of magnitude sufficiently small as not to affect normal operation of the laser diode.

3. A method as claimed in claim 1 in which the modulation current is increased by the predetermined test amount.

4. A method as claimed in claim 1 in which the predetermined test amount by which the modulation current is altered does not exceed 5% of the value of the modulation current when the modulation current is being altered.

5. A method as claimed in claim 1 in which the predetermined test amount by which the modulation current is altered does not exceed 1% of the value of the modulation current when the modulation current is being altered.

6. A method as claimed in claim 1 in which the modulation current to the laser diode is altered by a predetermined correcting amount in response to the slope value of the power/current characteristic curve not comparing favourably with the reference slope value.

7. A method as claimed in claim 6 in which the correcting amount by which the modulation current is altered in response to the slope not comparing favourably with the reference slope value does not exceed 1% of the maximum value of the modulation current which may be applied to the laser diode.

8. A method as claimed in claim 1 in which the reference slope value is set and stored during calibration of the laser diode.

9. A method as claimed in claim 8 in which the stored reference slope value is a reference value of the change in the average power output of the laser diode which should result from the alteration to the modulation current by the predetermined test amount if the laser diode were operating at the desired extinction ratio.

10. A method as claimed in claim 1 in which the bias current to the laser diode is altered by a predetermined correcting amount in response to the average power output not comparing favourably with the reference average power output value.

11. A method as claimed in claim 1 in which the bias current to the laser diode is maintained constant during the period while the slope value of the power/current characteristic curve is being determined.

12. A control circuit for controlling the extinction ratio of a laser diode, the control circuit comprising:
    (a) a power output comparing means for comparing the average power output of the laser diode with a predetermined reference average power output value,
    (b) a bias current control means for controlling the bias current to the laser diode, the bias current control means being responsive to the power output comparing means for altering the bias current to the laser diode in response to the average power output of the laser diode not comparing favourably with the reference average power output value,
    (c) a first control means for controlling the modulation current to the laser diode,
    (d) a second control means for altering the modulation current to the laser diode by a predetermined test amount for a period sufficient to allow a determination to be made of a corresponding change in the average power output of the laser diode resulting from the alteration to the modulation current, the predetermined test amount by which the modulation current is altered being proportional to the modulation current when the modulation current is being altered,
    (e) a means for determining the corresponding change in the average power output of the laser diode resulting from the alteration of the modulation current by the test amount for determining a value of the power/current characteristic curve of the laser diode indicative of the slope of the operating portion of the power/current characteristic curve, and (f) a slope comparing means for comparing the value indicative of the slope of the power/current characteristic curve with a corresponding predetermined reference slope value, the first control means being responsive to the slope comparing means for altering the modulation current to the laser diode in response to the slope value of the power/current characteristic curve not comparing favorably with the reference slope value, wherein the slope comparing means, and the power output comparing means are alternately operable.

13. A control circuit as claimed in claim 12 in which the slope comparing means compares the change in the average power output of the laser diode with a predetermined reference average power output value.

14. A control circuit as claimed in claim 12 in which the predetermined test amount by which the modulation current is altered by the second control means is such as not to affect the normal operation of the laser diode.

15. A control circuit as claimed in claim 12 in which the second control means increases the modulation current by the predetermined test amount.

16. A control circuit as claimed in claim 12 in which the predetermined test amount by which the modulation current is altered by the second control means does not exceed 5% of the modulation current when the modulation current is being altered.

17. A control circuit as claimed in claim 12 in which the predetermined test amount by which the modulation current is altered by the second control means does not exceed 1% of the modulation current when the modulation current is being altered.

18. A control circuit as claimed in claim 12 in which the first control means alters the modulation current by a predetermined correcting amount in response to the slope value not comparing favourably with the reference slope value.

19. A control circuit as claimed in claim 18 in which the correcting amount by which the first control means alters the modulation current in response to the slope value not comparing favourably with the reference slope value does not exceed 1% of the maximum value of the modulation current which may be applied by the first control means.

20. A control circuit as claimed in claim 12 in which the bias current control means holds the bias current constant while the second control means is altering the modulation current by the predetermined test amount.

21. A control circuit as claimed in claim 12 in which a means is provided for setting the predetermined reference slope value.

22. A laser diode driver circuit comprising:
(a) a modulation current source for providing a current for modulation in response to a data stream to be transmitted by the laser diode,
(b) a bias current source for providing a bias current to the laser diode,
(c) a control circuit for controlling the extinction ratio of the laser diode, the control circuit comprising:
(d) a power output comparing means for comparing the average power output of the laser diode with a predetermined reference average power output value,
(e) a bias current control means for controlling the bias current source for controlling the bias current to the laser diode, the bias current control means being responsive to the power output comparing means for altering the bias current to the laser diode in response to the average power output of the laser diode not comparing favourably with the reference average power output value,
(f) a first control means for controlling the modulation current source for controlling the modulation current to the laser diode,
(g) a second control means for altering the modulation current to the laser diode by a predetermined test amount for a period sufficient to allow a determination to be made of a corresponding change in the average power output of the laser diode resulting from the alteration to the modulation current, the predetermined test amount by which the modulation current is altered being proportional to the modulation current when the modulation current is being altered,
(h) a means for determining the corresponding change in the average power output of the laser diode resulting from the alteration of the modulation current by the test amount for determining a value of the power/current characteristic curve of the laser diode indicative of the slope of the operating portion of the power/current characteristic curve,
(i) a slope comparing means for comparing the value indicative of the slope of the power/current characteristic curve with a corresponding predetermined reference slope value, the first control means being responsive to the slope comparing means for altering the modulation current to the laser diode in response to the slope value of the power/current characteristic curve not comparing favourably with the reference slope value, wherein the slope comparing means and the power output comparing means are alternately operable.

23. A method as claimed in claim 1 in which the bias current to the laser diode is maintained constant during the period while the modulation current is altered by the predetermined test amount.

24. A method for controlling the extinction ratio of a laser diode by sequentially carrying out the steps of:
(a) comparing the average power output of the laser diode with a predetermined reference average power output value,
(b) varying the bias current to the laser diode in response to the average power output not comparing favourably with the reference average power output value,
(c) altering the modulation current to the laser diode by a predetermined test amount until a determination is made of a corresponding change in the average power output of the laser diode resulting from the alteration to the modulation current, the predetermined test amount by which the modulation current is altered being proportional to the modulation current when the modulation current is being altered,
(d) determining the corresponding change in the average power output of the laser diode resulting from the alteration to the modulation current by the test amount for determining a value of the power/current characteristic curve of the laser diode indicative of the slope of the operating portion of the power/current characteristic curve,
(e) comparing the value indicative of the slope of the power/current characteristic curve with a predetermined corresponding reference slope value, and (f) altering the modulation current to the laser diode in response to the determined slope value not comparing favorably with the reference slope value.

25. A method for controlling the extinction ratio of a laser diode by sequentially carrying out the steps of:
 (a) comparing the average power output of the laser diode with a predetermined reference average power output value,
 (b) varying the bias current to the laser diode in response to the average power output not comparing favourably with the reference average power output value,
 (c) altering the modulation current to the laser diode by a predetermined test amount for a period sufficient to allow a determination to be made of a corresponding change in the average power output of the laser diode resulting from the alteration to the modulation current,
 (d) determining the corresponding change in the average power output of the laser diode resulting from the alteration to the modulation current by the test amount for determining a value of the power/current characteristic curve of the laser diode indicative of the slope of the operating portion of the power/current characteristic curve,
 (e) comparing the value indicative of the slope of the power/current characteristic curve with a predetermined corresponding reference slope value, and
 (f) altering the modulation current to the laser diode in response to the determined slope value not comparing favorably with the reference slope value.

26. A method for controlling the extinction ratio of a laser diode by sequentially carrying out the steps of:
 (a) comparing the average power output of the laser diode with a predetermined reference average power output value,
 (b) varying the bias current to the laser diode in response to the average power output not comparing favourably with the reference average power output value,
 (c) altering the modulation current to the laser diode by a predetermined test amount for a period sufficient to allow a determination to be made of a corresponding change in the average power output of the laser diode resulting from the alteration to the modulation current, the predetermined test amount by which the modulation current is altered being an amount not exceed 5% of the value of the modulation current when the modulation current is being altered,
 (d) determining the corresponding change in the average power output of the laser diode resulting from the alteration to the modulation current by the test amount for determining a value of the power/current characteristic curve of the laser diode indicative of the slope of the operating portion of the power/current characteristic curve,
 (e) comparing the value indicative of the slope of the power/current characteristic curve with a predetermined corresponding reference slope value, and
 (f) altering the modulation current to the laser diode for correcting the extinction ratio in response to the determined slope value not comparing favorably with the reference slope value.

27. A method for controlling the extinction ration of a laser diode by sequentially carrying out the steps of:
 (a) comparing the average power output of the laser diode with a predetermined reference average power output value, the modulation current being maintained constant while the average power output of the laser diode is being compared with the predetermined reference average power output value,
 (b) varying the bias current to the laser diode in response to the average power output not comparing favourably with the reference average power output value,
 (c) altering the modulation current to the laser diode by a predetermined test amount for a period sufficient to allow a determination to be made of a corresponding change in the average power output of the laser diode resulting from the alteration to the modulation current, the predetermined test amount by which the modulation current is altered being proportional to the modulation current when the modulation current is being altered,
 (d) determining the corresponding change in the average power output of the laser diode resulting from the alteration to the modulation current by the test amount for determining a value of the power/current characteristic curve of the laser diode indicative of the slope of the operating portion of the power/current characteristic curve,
 (e) comparing the value indicative of the slope of the power/current characteristic curve with a predetermined corresponding reference slope value, and
 (f) altering the modulation current to the laser diode for correcting the extinction ratio in response to the determined slope value not comparing favourably with the reference slope value.

28. A method as claimed in claim 27 in which the bias current to the laser diode is maintained constant during the period while the modulation current is altered by the predetermined test amount.

29. A method for controlling the extinction ratio of a laser diode by sequentially carrying out the steps of:
 (a) comparing the average power output of the laser diode with a predetermined reference average power output value,
 (b) varying the bias current to the laser diode in response to the average power output not comparing favourably with the reference average power output value,
 (c) altering the modulation current to the laser diode by a predetermined test amount for a period sufficient to allow a determination to be made of a corresponding change in the average power output of the laser diode resulting from the alteration to the modulation current, the bias current being maintained constant during the period while the modulation current is altered by the predetermined test amount,
 (d) determining the corresponding change in the average power output of the laser diode resulting from the alteration to the modulation current by the test amount for determining a value of the power/current characteristic curve of the laser diode indicative of the slope of the operating portion of the power/current characteristic curve,
 (e) comparing the value indicative of the slope of the power/current characteristic curve with a predetermined corresponding reference slope value, and
 (f) altering the modulation current to the laser diode in response to the determined slope value not comparing favorably with the reference slope value.

30. A method as claimed in claim 29 in which the modulation current is maintained constant while the average power output of the laser diode is being compared with the predetermined reference average power output value.

31. A control circuit for controlling the extinction ratio of a laser diode, the control circuit comprising:

(a) a power output comparing means for comparing the average power output of the laser diode with a predetermined reference average power output value, (b) a bias current control means for controlling the bias current to the laser diode, the bias current control means being responsive to the power output comparing means for altering the bias current to the laser diode in response to the average power output of the laser diode not comparing favourably with the reference average power output value, (c) a first control means for controlling the modulation current to the laser diode, (d) a second control means for altering the modulation current to the laser diode by a predetermined test amount until a determination is made of a corresponding change in the average power output of the laser diode resulting from the alteration to the modulation current, the predetermined test amount by which the modulation current is altered being proportional to the modulation current when the modulation current is being altered, (e) a means for determining the corresponding change in the average power output of the laser diode resulting from the alteration of the modulation current by the test amount for determining a value of the power/current characteristic curve of the laser diode indicative of the slope of the operating portion of the power/current characteristic curve, and (f) a slope comparing means for comparing the value indicative of the slope of the power/current characteristic curve with a corresponding predetermined reference slope value, the first control means being responsive to the slope comparing means for altering the modulation current to the laser diode in response to the slope value of the power/current characteristic curve not comparing favourably with the reference slope value, wherein the slope comparing means and the power output comparing means are alternately operable.

32. A control circuit for controlling the extinction ratio of a laser diode, the control circuit comprising:

(a) a power output comparing means for comparing the average power output of the laser diode with a predetermined reference average power output value, (b) a bias current control means for controlling the bias current to the laser diode, the bias current control means being responsive to the power output comparing means for altering the bias current to the laser diode in response to the average power output of the laser diode not comparing favourably with the reference average power output value, (c) a first control means for controlling the modulation current to the laser diode, (d) a second control means for altering the modulation current to the laser diode by a predetermined test amount until a determination is made of a corresponding change in the average power output of the laser diode resulting from the alteration to the modulation current, (e) a means for determining the corresponding change in the average power output of the laser diode resulting from the alteration of the modulation current by the test amount for determining a value of the power/current characteristic curve of the laser diode indicative of the slope of the operating portion of the power/current characteristic curve, and (f) a slope comparing means for comparing the value indicative of the slope of the power/current characteristic curve with a corresponding predetermined reference slope value, the first control means being responsive to the slope comparing means for altering the modulation current to the laser diode in response to the slope value of the power/current characteristic curve not comparing favorably with the reference slope value, wherein the slope comparing means and the power output comparing means are alternately operable.

33. A control circuit for controlling the extinction ratio of a laser diode, the control circuit comprising:

(a) a power output comparing means for comparing the average power output of the laser diode with a predetermined reference average power output value, (b) a bias current control means for controlling the bias current to the laser diode, the bias current control means being responsive to the power output comparing means for altering the bias current to the laser diode in response to the average power output of the laser diode not comparing favourably with the reference average power output value, (c) a first control means for controlling the modulation current to the laser diode, (d) a second control means for altering the modulation current to the laser diode by a predetermined test amount for a period sufficient to allow a determination to be made of a corresponding change in the average power output of the laser diode resulting from the alteration to the modulation current, the predetermined test amount by which the modulation current is altered being an amount not exceeding 5% of the value of the modulation current when the modulation current is being altered, (e) a means for determining the corresponding change in the average power output of the laser diode resulting from the alteration of the modulation current by the test amount for determining a value of the power/current characteristic curve of the laser diode indicative of the slope of the operating portion of the power/current characteristic curve, and (f) a slope comparing means for comparing the value indicative of the slope of the power/current characteristic curve with a corresponding predetermined reference slope value, the first control means being responsive to the slope comparing means for altering the modulation current to the laser diode in response to the slope value of the power/current characteristic curve not comparing favorably with the reference slope value, wherein the slope comparing means and the power output comparing means are alternately operable.

34. A control circuit for controlling the extinction ratio of a laser diode, the control circuit comprising:

(a) a power output comparing means for comparing the average power output of the laser diode with a predetermined reference average power output value, (b) a bias current control means for controlling the bias current to the laser diode, the bias current control means being responsive to the power output comparing means for altering the bias current to the laser diode in response to the average power output of the laser diode not comparing favourably with the reference average power output value, (c) a first control means for controlling the modulation current to the laser diode, (d) a second control means for altering the modulation current to the laser diode by a predetermined test amount for a period sufficient to allow a determination to be made of a corresponding change in the average power output of the laser diode resulting from the alteration to the modulation current, the bias current control means holds the bias current constant during the period while the modulation current is altered by the predetermined test amount by the second control means, (e) a means for determining the corresponding change in the average power output of the laser diode resulting from the alteration of the modulation current by the test amount for determining a value of the power/current characteristic curve of the laser diode indicative of the slope of the operating portion of the power/current characteristic curve, and (f) a slope comparing means for comparing the value indicative of the slope of the power/current characteristic curve with a corresponding predetermined reference slope value, the first control means being responsive to the slope comparing means for altering the modulation current to the laser diode in response to the slope value of the power/current characteristic curve not comparing favourably with the reference slope value, wherein the slope comparing means and the power output comparing means are alternately operable.

35. A control circuit for controlling the extinction ratio of a laser diode, the control circuit comprising:

(a) a power output comparing means for comparing the average power output of the laser diode with a predetermined reference average power output value, (b) a bias current control means for controlling the bias current to the laser diode, the bias current control means being responsive to the power output comparing means for altering the bias current to the laser diode in response to the average power output of the laser diode not comparing favourably with the reference average power output value, (c) a first control means for controlling the modulation current to the laser diode, (d) a second control means for altering the modulation current to the laser diode by a predetermined test amount for a period sufficient to allow a determination to be made of a corresponding change in the average power output of the laser diode resulting from the alteration to the modulation current, the predetermined test amount by which the modulation current is altered being proportional to the modulation current when the modulation current is being altered, and the second control means holds the modulation current constant while the power output comparing means is comparing the average power output of the laser diode with the predetermined reference average power output value, (e) a means for determining the corresponding change in the average power output of the laser diode resulting from the alteration of the modulation current by the test amount for determining a value of the power/current characteristic curve of the laser diode indicative of the slope of the operating portion of the power/current characteristic curve, and (f) a slope comparing means for comparing the value indicative of the slope of the power/current characteristic curve with a corresponding predetermined reference slope value, the first control means being responsive to the slope comparing means for altering the modulation current to the laser diode in response to the slope value of the power/current characteristic curve not comparing favourably with the reference slope value, wherein the slope comparing means and the power output comparing means are alternately operable.

36. A control circuit as claimed in 35 in which the bias current control means holds the bias current constant during the period while the modulation current is altered by the predetermined test amount by the second control means.

* * * * *